US006682877B2

(12) United States Patent
Wyatt et al.

(10) Patent No.: US 6,682,877 B2
(45) Date of Patent: Jan. 27, 2004

(54) DIISOPROPYLBENZENE CONTAINING SOLVENT AND METHOD OF DEVELOPING FLEXOGRAPHIC PRINTING PLATES

(76) Inventors: Marion F. Wyatt, 429 Pablo Point Dr., Jacksonville, FL (US) 32225; R. Scott Gallagher, 1620 Kingswood Rd., Jacksonville, FL (US) 32207

( * ) Notice: Subject to any disclaimer, the term of this patent is extended or adjusted under 35 U.S.C. 154(b) by 0 days.

(21) Appl. No.: 10/243,061

(22) Filed: Sep. 13, 2002

(65) Prior Publication Data

US 2003/0118946 A1 Jun. 26, 2003

Related U.S. Application Data

(63) Continuation of application No. 09/696,277, filed on Oct. 25, 2000, now abandoned, which is a continuation of application No. 09/427,212, filed on Oct. 26, 1999, now Pat. No. 6,162,593.

(51) Int. Cl.[7] .................................................. G03F 7/32
(52) U.S. Cl. ....................................................... 430/331
(58) Field of Search .......................................... 430/331

(56) References Cited

U.S. PATENT DOCUMENTS

| | | |
|---|---|---|
| 4,267,260 A | 5/1981 | Miura et al. |
| 4,271,261 A | 6/1981 | Shimizu et al. |
| 4,806,452 A | 2/1989 | Hoffmann et al. |
| 4,847,182 A | 7/1989 | Worns et al. |
| 4,992,108 A | 2/1991 | Ward et al. |
| 5,061,606 A | 10/1991 | Telser et al. |
| 5,077,177 A | 12/1991 | Frass et al. |
| 5,312,719 A | 5/1994 | Schlosser et al. |
| 5,578,420 A | 11/1996 | Takagi et al. |

*Primary Examiner*—Hoa Van Le
(74) *Attorney, Agent, or Firm*—Thomas C. Saitta

(57) ABSTRACT

This invention describes photopolymer printing plate developing solvents comprising diisopropylbenzene, alone or in combination with one or more co-solvents. Compared with solvents of the prior art, the developing solvents of the present invention have lower toxicity, higher flash points, a milder and more pleasant odor, increased resistance to thermal decomposition, higher solvency, faster dry time, and pose reduced threat to the environment. The solvents of the present invention can exhibit azeotropic-like properties resulting in improved recycling characteristics and reduced drying times. Also, the solvents of the present invention exhibit a degree of selective solvency towards non-crosslinked photopolymers vs. crosslinked photopolymers that is not seen in solvents of the prior art.

15 Claims, No Drawings

DIISOPROPYLBENZENE CONTAINING SOLVENT AND METHOD OF DEVELOPING FLEXOGRAPHIC PRINTING PLATES

This application is a continuation of application Ser. No. 09/696,277, filed Oct. 25, 2000 now abandoned, which is a continuation of application Ser. No. 09/427,212, filed Oct. 26, 1999, which issued on Dec. 19, 2000, as U.S. Pat. No. 6,152,593.

BACKGROUND

1. Field of Invention

This invention relates to the development of flexographic (photopolymer) printing plates using an improved developer solvent. More specifically, this invention relates to the use of diisopropylbenzene alone, or in combination with a co-solvent(s), as a washout solvent for the non-crosslinked polymer material in the printing plates to develop the relief image. Diisopropylbenzene is non-toxic, can develop plates quickly, causes minimal plate swelling and distortion, dries quickly, is easy to reclaim by distillation, has a very mild odor, has a reasonably low cost, is thermally stable, and works on virtually all known solvent-developed photopolymer plate types.

Ease of recycling of flexographic developer solvents is important to reduce waste, and because it is often more cost-effective to recycle than to continually replace used developer solvent with new. In this regard, azeotropic or azeotrope-like compositions that exhibit reduced boiling points, enhanced recovery rates and limited fractionation upon distillation are desirable. Thus, there is a need for an environmentally-friendly, easily recyclable, preferably azeotropic or azeotrope-like, low vapor pressure, high flash point, solvent that effectively develops flexographic printing plates. The present invention addresses this need.

The diisopropylbenzene-based solvents show selective solubility for non-crosslinked photopolymer material vs. crosslinked photopolymer material when compared to solvents of the prior art. This results in a reduction of plate swelling, image distortion and drying times.

2. Description of Prior Art

Flexography is a type of relief printing that uses flexible sheets of photopolymer to transfer an image onto a substrate. In the flexography process, photopolymer sheet is exposed to light through a negative or mask that blocks selected portions of the photopolymer from the light. The portions of the photopolymer that are exposed to light crosslink. The non-crosslinked photopolymer is soluble in many organic solvents, whereas the crosslinked photopolymer is harder and much more resistant to chemical solvent attack. By "washing" the selectively-exposed photopolymer sheet in a solvent bath, the unexposed portions of the plate are removed, a process known as developing. The resulting developed plate will contain a raised relief image in those areas where light passed through the negative. The flexible relief plate is wrapped around a cylinder on a printing press, and used to transfer ink onto a substrate, such as paper, film, bags, etc.

While many organic solvents are capable of dissolving non-crosslinked material from the plate, only a few are considered good developer solvents. This is because most solvents that dissolve the non-crosslinked material also absorb into the crosslinked portions of the plate, causing these areas to soften and swell, thus changing the shape of the plate. This softening and swelling encourages erosion of the relief image by the brush in the developer tank. This erosion results in the final image on the plate becoming different from the target image on the negative. Hence printing quality suffers. The ideal developer solvent would dissolve and remove the non-crosslinked portions of the plate while at the same time not softening or swelling the crosslinked portions.

The general process of developing flexographic plates is well-known and described in detail in a number of U.S. patents including Miura (U.S. Pat. No. 4,267,260), Shimizu (U.S. Pat. No. 4,271,261), Merrem (U.S. Pat. No. 4,539,288), Brault (U.S. Pat. No. 4,665,009), Hoffmann (U.S. Pat. No. 4,806,452), Kobayashi (U.S. Pat. No. 4,844,832), Worns (U.S. Pat. No. 4,847,182), Telser (U.S. Pat. No. 5,061,606), Frass (U.S. Pat. No. 5,077,177), Frass (U.S. Pat. No. 5,116,720), Telser (U.S. Pat. No. 5,128,234), Telser (U.S. Pat. No. 5,176,986), Larimer (U.S. Pat. No. 5,204,227), Telser (U.S. Pat. No. 5,240,815), Bach (U.S. Pat. No. 5,252,432), Schlosser (U.S. Pat. No. 5,312,719), Schober (U.S. Pat. No. 5,354,645), and Takagi (U.S. Pat. No. 5,578,420). However, the process or solvents used in these patents all suffer from numerous drawbacks, as explained below.

As Telser discusses in U.S. Pat. No. 5,061,606 most modern photopolymer printing plates generally have a multilayer structure. Typically the topmost layer is composed of a thin (5 micrometers in thickness) layer of polyamide referred to as the "cover layer" that serves to protect the delicate photopolymer during handling and exposure. Because this layer is resistant to some photopolymer developer solvents, an additive co-solvent is often incorporated into the developing solution to facilitate removal of this cover layer in the developing bath. Because polyamide is soluble in most organic alcohols, developing solutions typically contain a low percentage (10–30%) of an organic alcohol for this purpose.

Originally, exposed photopolymer plates were developed with a solvent mixture consisting of perchloroethylene to dissolve uncured photopolymer and butanol to remove the protective cover layer. However, this solvent mixture is toxic and dangerous, and therefore is no longer used (perchloroethylene is widely recognized to be carcinogenic, and butanol is flammable). A number of replacement solvents have been proposed to replace perc/butanol, but virtually all known mixtures have serious disadvantages.

For instance, in U.S. Pat. No. 4,267,260 Miura disclosed as early as 1981 that glycol ethers, DMSO, NMP, diethylformamide, xylene, cyclohexane, and monochlorobenzene can be used to develop plates, but they cause the plates to "swell" resulting in poor image quality during printing. In addition, diethylformamide (flash point 60° C.), xylene (flash point 25° C.) and cyclohexane (flash point –18° C.) are flammable, making them dangerous or expensive to use, and DMSO has an intensely strong odor that is offensive. Further, glycol ethers are only effective on certain plate types, and therefore are restricted to a very small portion of the industry. In U.S. Pat. No. 4,271,261 Shimizu teaches the use of glycol ethers in combination with acids and/or gamma-butyrolactone (GBL). However, acids are corrosive and therefore attack machine parts, and are severe skin and eye irritants. Further, gamma-butyrolactone is not effective on many plate types. In U.S. Pat. No. 4,806,452 Hoffmann teaches the use of terpene hydrocarbons such as d-limonene in developer solvents, but terpene hydrocarbons have intense odors, are moderate skin and eye irritants, and have flash points below 141° F., making the waste solvent mixture "hazardous" by RCRA guidelines. This leads to increased disposal cost and high regulatory compliance costs. Other inventors discuss the use of chlorinated solvents (which are toxic to people or are dangerous to the environment), mixed low-molecular-weight aromatic solvents (which are odoriferous and relatively toxic), and ketones (which are overly aggressive and odiferous). All of these solvents cause excessive plate swelling and/or cause plates to delaminate (come apart) during developing, and therefore are not useful. Low toxicity saturated hydrocarbons are also discussed, but they exhibit very poor solvency and therefore cannot process plates quickly enough. In U.S. Pat. No. 4,847,182 Worns discloses the use of d-limonene in combination with water, benzyl alcohol, and/or butanol as a developer solvent, but this invention suffers from the strong odor of d-limonene, as well as the low flash point of d-limonene that makes the waste solvent a RCRA hazardous waste. In U.S. Pat. No. 5,061,606 Telser discloses the use of hydrogenated petroleum fractions in combination with low levels of alcohols (to remove the cover layer) and monoterpenes (added as odorants), but this combination has poor solvency and therefore develops conventional plates much too slowly to be practical. In U.S. Pat. No. 5,077,177 Frass discloses the use of phenyl ethers as developers, but these solvents also have very strong odors which make them undesirable, and they generally have flash points too low to be practical (<141° F.). Further, Frass explains that d-limonene has the additional deficiency of not being able to develop plates containing nitrile rubber. In U.S. Pat. No. 5,312,719 Schlosser discloses the use of mixed aromatic solvents in combination with butanol and 2-ethyl butanol. Unfortunately, these mixed aromatic solvents are relatively toxic and distinctly odoriferous, and both butanol and 2-ethyl butanol are very odoriferous and have flash points below 141° F., making the waste solvent hazardous. Therefore this combination is impractical. Finally, in U.S. Pat. No. 5,578,420 Takagi teaches the use of a 3-part solvent blend containing (A) mixed aromatic solvents to dissolve the photopolymer, (B) an alcohol to remove the protective "anti-tack resin layer" or cover layer, and (C) isobutyl isobutyrate as an odor masking agent. This invention is typical of prior art inventions in that it suffers from several common problems:

1. The developer solvent contains 25–70% of mixed aromatic solvents such as Solvesso 150 (product of Exxon Chemical Japan Limited) that have high odor intensity and moderate toxicity. These solvents are so odoriferous that an odor masking agent is required;
2. The mixed low molecular weight aromatic solvents are so aggressive (dissolve the polymer so quickly) that concentrations above 70% excessively swell the photopolymer plate. For this reason a third component, that acts as a diluent, is added to "control the swelling action" of the active ingredient;
3. The developer solvent is a non-azeotropic blend of three components, all with different boiling points. Because spent solvent is always reclaimed by distillation in which components preferentially vaporize in boiling point order, the distilled solvent can easily end up being depleted of one or more critical components. For this reason it is desirable to have a solvent system with as few components as possible, preferably no more than two, or to have a solvent system which is azeotropic;
4. The so-called odor masking agent, isobutyl isobutyrate, has a flash point of only 99° F., classifying it as a flammable liquid. Addition of significant amounts of this solvent to the blend will reduce the flash point of the mixture below 141° F., causing the waste solvent to be classified as a RCRA hazardous waste. And although isobutyl isobutyrate is described as an odor-masking agent, it actually has a strong, unpleasant odor itself.

OBJECTS AND ADVANTAGES

It is the object of the present invention to provide a solvent that overcomes all of the above limitations and disadvantages of the prior art. Specifically, the objects and advantages of the present invention are:

(a) to provide a solvent that develops a wide range of solvent-developed photopolymer plates;

(b) to provide a solvent that has a flash point in excess of 141° F., so that the waste can be classified as non-hazardous after use;
(c) to provide a solvent that minimizes unwanted plate swelling in the developer bath;
(d) to provide a solvent that quickly dissolves uncured polymer but leaves the cured polymer intact;
(e) to provide a solvent that has low toxicity so as not to pose a threat to users;
(f) to provide a solvent that is environmentally safe, specifically a solvent that does not deplete the ozone layer or have an excessively long atmospheric lifetime;
(g) to provide a solvent that does not contain components listed as toxic or acutely toxic on the EPA Sara Title 3 Section 313 list of toxic substances;
(h) to provide a solvent that does not contain components that are classified as carcinogens, mutagens, or reproductive toxicants under California Proposition 65;
(i) to provide a solvent that is temperature-stable during distillation, so that minimal chemical decomposition occurs during reprocessing;
(j) to provide a solvent that does not contain components that are classified as hazardous air pollutants under the Federal Clean Air Act Amendments;
(k) to provide a solvent that has low vapor pressure, and therefore produces low VOC emissions, but, at the same time, evaporates quickly from developed plates;
(l) to provide a solvent that does not require adjustment after distillation (some multi-component mixtures require balancing after distillation because one or more components preferentially distill);
(m) to provide a solvent that is priced at a moderate level, so as to contribute to the overall economy of the flexographic printing process;
(n) to provide a solvent that has a very mild odor and therefore does not require an odor-masking agent;
(o) to provide a solvent that has a lower boiling point than the boiling point of its constituents to facilitate reprocessing;
(p) to provide a solvent that develops plates as rapidly as possible;
(q) to provide a solvent that dries as rapidly as possible after plate development;
(r) to provide a solvent that exhibits selective solvency for non-crosslinked photopolymer vs. crosslinked photopolymer;
(s) to provide a solvent that is a blend of components that forms a true azeotrope so that the composition does not change upon distillation.

To date, no solvent has been able to achieve all these objectives. We have found that these objectives can all be achieved simultaneously by a mixture comprising diisopropylbenzene. Further advantages of this invention will become apparent from a consideration of the ensuing description and examples.

SUMMARY

This invention comprises an improved process and solvent for developing photopolymer printing plates with the developer solvent comprising a blend of diisopropylbenzene alone or in combination with one or more co-solvents. The diisopropylbenzene-containing solvent or mixture exhibits azeotropic behavior, the mixture having a reduced boiling point as compared to the individual components and producing a vapor when boiled having the same composition as the mixture, which greatly enhances reclamation by distillation of the solvent for recycling. The solvent exhibits selective solvency for non-crosslinked photopolymers vs. crosslinked polymers in flexographic plates.

The diisopropylbenzene-containing solvent is safer, has lower odor intensity, develops plates faster, dries faster, produces a better quality image and is more easily recycled than solvents of the prior art. It is suitable for use in all conventional plate processing equipment with all commercially available solvent-processed plates and can be reclaimed in all conventional distillation reprocessing equipment.

DETAILED DESCRIPTION OF THE INVENTION

This invention comprises the use of diisopropylbenzene as a solvent for use in photopolymer printing plate processing. Diisopropylbenzene, which can be used either alone or in combination with other solvents, can be used to develop a wide array of different photopolymer printing plates.

Diisopropylbenzene is a chemical that is produced as an unwanted byproduct of the cumene manufacturing process, wherein benzene is reacted with propylene to form isopropylbenzene. Because it is a waste product that is derived from fossil fuels, any new and novel use for diisopropylbenzene will improve the yield of value-added products from our dwindling supply of natural resources.

The properties of diisopropylbenzene are as follows:

| | |
|---|---|
| Chemical Names | 1,4-diisopropylbenzene |
| | 1,3-diisopropylbenzene |
| | mixed diisopropylbenzenes |
| Chemical Formula | $C_6H_4[CH(CH_3)_2]_2=C_{12}H_{18}$ |
| CAS Numbers (respectively) | 100-18-5 (1,4 DIPB) |
| | 99-62-7 (1,3 DIPB) |
| | 25321-09-9 (mixed DIPB's) |
| Flash Point | 170° F. (76° C.) |
| Specific Gravity at 60° F. | 0.857 |
| Boiling Point | 210° C. (410° F.) |
| $LD_{50}$, oral rat (RTECS CZ6360000) | 6,300 mg/kg |

A number of other solvents can be mixed with diisopropylbenzene to enhance performance, alter physical properties, reduce cost or form an azeotrope. The suitable co-solvents include tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, 2-(2-butoxyethoxy) ethanol, napthenic hydrocarbons, paraffinic hydrocarbons, olefinic hydrocarbons, isoparaffinic hydrocarbons, terpene hydrocarbons and other similar solvents and diluents.

Ideally, the co-solvents should be miscible with diisopropylbenzene, have suitable solubility parameters, have suitable toxicity and safety profiles, be readily disposable, and have pleasant odors. These co-solvents are used to modify the properties of the solvent blend. This includes the addition of solvents to aid in the removal of the cover layer on the flexographic plate (tetrahydrofurfuryl alcohol, for example), improve the odor of the blend (limonene, for example), form an azeotrope (benzyl alcohol, for example) and/or make the reclamation of the solvent by distillation easier (mineral oil, for example).

These diisopropylbenzene-based developer solvents may be substituted for a number of solvents described in the prior art including petroleum distillates, synthetic hydrocarbons, terpene hydrocarbons, oxygenated solvents (alcohols, esters, ketones, ethers), mixed aromatic solvents, or halogenated hydrocarbon solvents presently used for processing photopolymer printing plates. For example diisopropylbenzene excels in the processing of photopolymer printing plates based on block copolymers of styrene and butadiene (SBS) or styrene and isoprene (SIS), copolymers of butadiene and acrylonitrile, terpolymers of butadiene, acrylonitrile and acrylic acid and other similar photopolymers. Diisopropylbenzene-based solvents can be applied to the plates by any conventional application means including spraying, brushing, rolling, dipping (immersing) or any combination thereof.

The diisopropylbenzene-based solvents produce photopolymer plates with less swelling and distortion than those processed with terpene hydrocarbons, lower molecular weight aromatic hydrocarbons or chlorinated hydrocarbon solvents. This reduction in swelling and distortion is surprising because while other aggressive flexographic developer solvents (such as terpene hydrocarbons, lower molecular weight aromatic hydrocarbons or chlorinated hydrocarbon solvents) may quickly remove the unexposed polymer in the development process, they also attack the exposed crosslinked polymer resulting in plate swelling, distortion of the image, actual damage to the plate and much longer drying times when compared to the diisopropylbenebased solvents. Flexographic solvents of the prior art have not exhibited this degree of selectivity for non-crosslinked polymer vs. crosslinked polymer.

Additionally, these solvents have fairly low volatility, which reduces inhalation exposure during plate processing, and limits volatile organic compound (VOC) emissions. Furthermore, diisopropylbenzene is less toxic than other developer solvents, including even natural terpene hydrocarbon solvents (which are often referred to as so-called "safe" solvents). Lastly, and just as importantly, solvents containing diisopropylbenzene have a very mild and acceptable odor, making them significantly more pleasant to use than solvents containing lower molecular weight aromatic solvents, terpene derivatives, esters, ketones, or low molecular weight alcohols. This is a significant advantage, as the odor of a strong-smelling developer solvent will often permeate an entire plate-processing facility, making the indoor environment uncomfortable.

This invention also relates to a process for the production of photopolymerization-crosslinked relief forms, such as photopolymer or flexographic printing plates. In the process, the layers which are crosslinkable by photopolymerization are image-wise exposed to the actinic light of light sources such as mercury vapor lamps or fluorescent tubes, the emitted wavelength ranging between about 230 and 450 nm, preferably between about 300 and 420 nm. The non-exposed and thus non-crosslinked portions of the layer are removed with the aid of the developing solvent according to the present invention, by spraying, washing or brushing. The developed relief forms are typically dried at temperatures up to about 140° F., and may be post-exposed to actinic light, either simultaneously or subsequently.

The photopolymerization-crosslinked relief forms according to the invention are advantageously used in the production of printing forms, especially letterpress and relief printing forms, which are particularly suitable for flexographic printing. The invention is further explained by the examples below.

Flexographic developer solvents are typically reprocessed after use by distillation to remove any dissolved or suspended polymer material so that the solvent can be reused. Important issues to be considered in this reclamation process are the boiling points of the different constituents in the solvent blend and the boiling point of the last material to come over in the distillation. If this final boiling point is too high, then distillation will be difficult because of the excessive temperatures required. Also, if the boiling point of the first material to come over is significantly lower than that of the last, then there is the potential to leave some of the higher boiling solvent behind in the distillation pot with the waste, resulting in an unbalanced developer solvent that is ineffective.

Reclamation tests on the diisopropylbenzene-based developer solvent have disclosed an unexpected advantage over the known solvents. Azeotropic behavior was observed in blends of diisopropylbenzene and benzyl alcohol or tetrahydrofurfuryl alcohol, such that the composition of the vapors upon boiling remained the same as the liquid solvent. Observed boiling points were significantly reduced throughout the boiling point range when compared to some, or all, of the individual constituents. This azeotropic behavior in combination with the lowered boiling points makes reprocessing by distillation much easier, and helps prevent loss of components.

For example, diisopropylbenzene blends containing various concentrations of benzyl alcohol were distilled to determine the equilibrium vapor concentration as a function of liquid composition during distillation. Azeotropic behavior was observed with a blend of approximately 60% diisopropylbenzene and 40% benzyl alcohol, i.e., the concentration of benzyl alcohol in the vapor was also 40%. At concentrations of approximately 50% benzyl alcohol, the percentage of benzyl alcohol in the vapor did not increase beyond 40%, while at a concentration of approximately 75% benzyl alcohol, the vapor concentration only rose to 45%. Conversely, at a concentration of approximately 25% benzyl alcohol, the vapor concentration was 33%. As is recognized in the art, it is not possible to predict the formation of azeotropes.

Table 4 and Table 5 show the distillation ranges determined for the diisopropylbenzene based solvent blends and their individual constituents using ASTM D 86-93. As is evident, the temperature at which the solvent of the present invention boils is lower than the boiling points of the constituents of the solvent, making recovery of the used solvent by distillation both easier and faster. The recovery of the solvent blends was also significantly higher at the completion of the distillations when compared to that of the constituents when tested alone. A higher recovery in solvent reprocessing is quite beneficial.

EXAMPLE 1

A commercially available 0.067" thick flexographic printing plate (Cyrel® EXL mfg. by Dupont) was first exposed from the back using a UV light source to form the crosslinked polymer floor of the printing plate. The back exposure was for 20 seconds, which is enough to give a floor thickness of 0.033" to 0.034" (half of the total plate thickness). Next, the top of the plate was exposed to a UV light source through a negative for 18 minutes in the exposure unit of a commercially available Kelleigh Model 310 Flexible Platemaker. The exposed plate was then developed by immersion (with rotary brushing) in a mixture of 85 wt % diisopropylbenzene and 15 wt % benzyl alcohol in the developer section of the Platemaker at a temperature of 25–30° C. The development process was continued until the plate floor (formed by the back exposure) was reached. The time required to reach the plate floor is the "Wash Time" as indicated in Table 1. The developed plate was then dried in a Fisher Isotemp® temperature controlled laboratory oven at 140° F. until it returned to it's original thickness, which is an indication that all absorbed solvent has been removed and the plate is ready to print. The time required for this part of the process is recorded as "Dry Time" in Table 1. After drying, the developed plate was examined with a 60× stereo microscope to determine the quality of the plate, with particular attention given to the sharpness of the dot structures, the shoulder structure on the relief image and the overall appearance of the plate. This "Image Quality" is noted in Table 1.

EXAMPLE 2

A flexographic printing plate (0.067" Cyrel® EXL mfg. by Dupont) was exposed and developed as in Example 1, except for the use of a developer solvent containing 100 wt % diisopropylbenzene. The results are included in Table 1.

EXAMPLE 3

A flexographic printing plate (0.067" Cyrel® EXL mfg. by Dupont) was exposed and developed as in Example 1, except for the use of a developer solvent containing 80 wt % diisopropylbenzene and 20 wt % tetrahydrofurfuryl alcohol. The results are included in Table 1.

EXAMPLE 4

A flexographic printing plate (0.067" Cyrel® EXL mfg. by Dupont) was exposed and developed as in Example 1, except for the use of a developer solvent containing 20 wt % diisopropylbenzene, 20 wt % benzyl alcohol and 60 wt % isoparaffinic hydrocarbon (EXXON Isopar® L). The results are included in Table 1.

EXAMPLE 5

A flexographic printing plate (0.067" Cyrel® EXL mfg. by Dupont) was exposed and developed as in Example 1, except for the use of a developer solvent containing 60 wt % diisopropylbenzene, 20 wt % benzyl alcohol and 20 wt % limonene. The results are included in Table 1.

COMPARATIVE EXAMPLE 1

A flexographic printing plate (0.067" Cyrel® EXL mfg. by Dupont) was exposed and developed as in Example 1, except for the use of a developer solvent containing 60 wt % aromatic petroleum distillate (Exxon Aromatic 150), 20 wt % benzyl alcohol and 20 wt % isobutyl isobutyrate (similar to a commercially available flexographic developer solvent). The results are included in Table 1.

COMPARATIVE EXAMPLE 2

A flexographic printing plate (0.067" Cyrel® EXL mfg. by Dupont) was exposed and developed as in Example 1, except for the use of a developer solvent containing 80 wt % limonene and 20 wt % benzyl alcohol. The results are included in Table 1.

COMPARATIVE EXAMPLE 3

A flexographic printing plate (0.067" Cyrel® EXL mfg. by Dupont) was exposed and developed as in Example 1, except for the use of a developer solvent containing 80 wt % isononyl acetate and 20 wt % benzyl alcohol (similar to a commercially available flexographic developer solvent). The results are included in Table 1.

COMPARATIVE EXAMPLE 4

A flexographic printing plate (0.067" Cyrel® EXL mfg. by Dupont) was exposed and developed as in Example 1, except for the use of a developer solvent containing 70 wt % isoheptyl acetate and 30 wt % isoheptyl alcohol (similar to a commercially available flexographic developer solvent).

The results are included in Table 1.

TABLE 1

(0.067" Cyrel ® EXL plate mfg. by Dupont)

| Examples | Developer Solvent (blends by weight %) | Plate Type and Thickness | Solvent Odor | Wash Time (min) | Dry Time (min) | Image Quality |
|---|---|---|---|---|---|---|
| Example 1 | 85% diisopropylbenzene 15% benzyl alcohol | 0.067" Cyrel ® EXL (mfg. by Dupont) | Mild | 6 min | 60 min | Excellent |
| Example 2 | 100% diisopropylbenzene | 0.067" Cyrel ® EXL (mfg. by Dupont) | Mild | 7 min | 65 min | Excellent |
| Example 3 | 80% diisopropylbenzene 20% tetrahydrofurfuryl alcohol | 0.067" Cyrel ® EXL (mfg. by Dupont) | Moderate | 7 min | 60 min | Excellent |
| Example 4 | 20% diisopropylbenzene 20% benzyl alcohol 60% isoparaffinic hydrocarbon (EXXON Isopar ® L) | 0.067" Cyrel ® EXL (mfg. by Dupont) | Mild | 8 min | 55 min | Excellent |
| Example 5 | 60% diisopropylbenzene 20% benzyl alcohol 20% limonene | 0.067" Cyrel ® EXL (mfg. by Dupont) | Mild | 5 min | 75 min | Excellent |
| Comparative Example 1 | 60% aromatic mixture (Exxon Aromatic 150) 20% benzyl alcohol 20% isobutyl isobutyrate | 0.067" Cyrel ® EXL (mfg. by Dupont) | Strong and Offensive | 8 min | 85 min | Good |
| Comparative Example 2 | 80% limonene 20% benzyl alcohol | 0.067" Cyrel ® EXL (mfg. by Dupont) | Strong | 6 min | 120 min | Fair (some dot loss) |
| Comparative Example 3 | 80% isononyl acetate 20% benzyl alcohol | 0.067" Cyrel ® EXL (mfg. by Dupont) | Strong and Offensive | 22 min | 90 min | Good |
| Comparative Example 4 | 70% isoheptyl acetate 30% isoheptyl alcohol | 0.067" Cyrel ® EXL (mfg. by Dupont) | Strong and Offensive | 8 min | 85 min | Good |

EXAMPLE 6

A commercially available 0.067" thick flexographic printing plate (EPIC® mfg. by PTI) was first exposed from the back using a UV light source to form the crosslinked polymer floor of the printing plate. The back exposure was for 24 seconds, which is enough to give a floor thickness of 0.033" to 0.034" (half of the total plate thickness). Next, the top of the plate was exposed to a UV light source through a negative for 22 minutes in the exposure unit of a commercially available Kelleigh Model 310 Flexible Platemaker. The exposed plate was then developed by immersion (with rotary brushing) in a mixture of 85 wt % diisopropylbenzene and 15 wt % benzyl alcohol in the developer section of the Platemaker at a temperature of 25–30 C. The development process was continued until the plate floor (formed by the back exposure) was reached. The time required to reach the plate floor is the "Wash Time" as indicated in Table 2. The developed plate was then dried in a Fisher Isotemp® temperature controlled laboratory oven at 140° F. until it returned to it's original thickness, which is an indication that all absorbed solvent has been removed and the plate is ready to print. The time required for this part of the process is recorded as "Dry Time" in Table 2. After drying, the developed plate was examined with a 60× stereo microscope to determine the quality of the plate, with particular attention given to the sharpness of the dot structures, the shoulder structure on the relief image and the overall appearance of the plate. This "Image Quality" is noted in Table 2.

EXAMPLE 7

A flexographic printing plate (0.067" EPIC® mfg. by PTI) was exposed and developed as in Example 6, except for the use of a developer solvent containing 100 wt % diisopropylbenzene. The results are included in Table 2.

EXAMPLE 8

A flexographic printing plate (0.067" EPIC® mfg. by PTI) was exposed and developed as in Example 6, except for the use of a developer solvent containing 80 wt % diisopropylbenzene and 20 wt % tetrahydrofurfuryl alcohol. The results are included in Table 2.

EXAMPLE 9

A flexographic printing plate (0.067" EPIC® mfg. by PTI) was exposed and developed as in Example 6, except for the use of a developer solvent containing 20 wt % diisopropylbenzene, 20 wt % benzyl alcohol and 60 wt % isoparaffinic hydrocarbon (EXXON Isopar® L). The results are included in Table 2.

EXAMPLE 10

A flexographic printing plate (0.067" EPIC® mfg. by PTI) was exposed and developed as in Example 6, except for the use of a developer solvent containing 60 wt % diisopropylbenzene, 20 wt % benzyl alcohol and 20 wt % limonene. The results are included in Table 2.

COMPARATIVE EXAMPLE 5

A flexographic printing plate (0.067" EPIC® mfg. by PTI) was exposed and developed as in Example 6, except for the use of a developer solvent containing 60 wt % aromatic petroleum distillate (Exxon Aromatic 150), 20 wt % benzyl alcohol and 20 wt % isobutyl isobutyrate (similar to a commercially available flexographic developer solvent). The results are included in Table 2.

COMPARATIVE EXAMPLE 6

A flexographic printing plate (0.067" EPIC® mfg. by PTI) was exposed and developed as in Example 6, except for the use of a developer solvent containing 80 wt % limonene and 20 wt % benzyl alcohol. The results are included in Table 2.

COMPARATIVE EXAMPLE 7

A flexographic printing plate (0.067" EPIC® mfg. by PTI) was exposed and developed as in Example 6, except for the use of a developer solvent containing 80 wt % isononyl acetate and 20 wt % benzyl alcohol (similar to a commercially available flexographic developer solvent). The results are included in Table 2.

COMPARATIVE EXAMPLE 8

A flexographic printing plate (0.067" EPIC® mfg. by PTI) was exposed and developed as in Example 6, except for the use of a developer solvent containing 70 wt % isoheptyl acetate and 30 wt % isoheptyl alcohol (similar to a commercially available flexographic developer solvent). The results are included in Table 2.

overall appearance of the plate. This "Image Quality" is noted in Table 3.

EXAMPLE 12

A flexographic printing plate (0.250" Cyrel® TDR mfg. by Dupont) was exposed and developed as in Example 11, except for the use of a developer solvent containing 100 wt % diisopropylbenzene. The results are included in Table 3.

EXAMPLE 13

A flexographic printing plate (0.250" Cyrel® TDR mfg. by Dupont) was exposed and developed as in Example 11,

TABLE 2

(0.067" EPIC ® plate mfg. by PTI)

| Examples | Developer Solvent (blends by weight %) | Plate Type and Thickness | Solvent Odor | Wash Time (min) | Dry Time (min) | Image Quality |
|---|---|---|---|---|---|---|
| Example 6 | 85% diisopropylbenzene<br>15% benzyl alcohol | 0.067" EPIC ®<br>(mfg. by PTI) | Mild | 6 min | 60 min | Excellent |
| Example 7 | 100% diisopropylbenzene | 0.067" EPIC ®<br>(mfg. by PTI) | Mild | 8 min | 65 min | Excellent |
| Example 8 | 80% diisopropylbenzene<br>20% tetrahydrofurfuryl alcohol | 0.067" EPIC ®<br>(mfg. by PTI) | Moderate | 7 min | 65 min | Excellent |
| Example 9 | 20% diisopropylbenzene<br>20% benzyl alcohol<br>60% isoparaffinic hydrocarbon<br>(EXXON Isopar ® L) | 0.067" EPIC ®<br>(mfg. by PTI) | Mild | 8 min | 60 min | Excellent |
| Example 10 | 60% diisopropylbenzene<br>20% benzyl alcohol<br>20% limonene | 0.067" EPIC ®<br>(mfg. by PTI) | Moderate | 6 min | 80 min | Excellent |
| Comparative Example 5 | 60% aromatic mixture (Exxon Aromatic 150)<br>20% benzyl alcohol<br>20% isobutyl isobutyrate | 0.067" EPIC ®<br>(mfg. by PTI) | Strong and Offensive | 9 min | 90 min | Good |
| Comparative Example 6 | 80% limonene<br>20% benzyl alcohol | 0.067" EPIC ®<br>(mfg. by PTI) | Strong | 7 min | 125 min | Fair (some dot loss) |
| Comparative Example 7 | 80% isononyl acetate<br>20% benzyl alcohol | 0.067" EPIC ®<br>(mfg. by PTI) | Strong and Offensive | 20 min | 85 min | Good |
| Comparative Example 8 | 70% isoheptyl acetate<br>30% isoheptyl alcohol | 0.067" EPIC ®<br>(mfg. by PTI) | Strong and Offensive | 9 min | 90 min | Good |

EXAMPLE 11

A commercially available 0.250" thick flexographic printing plate (Cyrel® TDR mfg. by Dupont) was first exposed from the back using a UV light source to form the crosslinked polymer floor of the printing plate. The back exposure was for 190 seconds, which is long enough to give a floor thickness of about 0.125" (half of the total plate thickness). Next, the top of the plate was exposed to a UV light source through a negative for 25 minutes in the exposure unit of a commercially available Kelleigh Model 310 Flexible Platemaker. The exposed plate was then developed by immersion (with rotary brushing) in a mixture of 85 wt % diisopropylbenzene and 15 wt % benzyl alcohol in the developer section of the Platemaker at a temperature of 25–30° C. The development process was continued until the plate floor (formed by the back exposure) was reached. The time required to reach the plate floor is the "Wash Time" as indicated in Table 3. The developed plate was then dried in a Fisher Isotemp® temperature controlled laboratory oven at 140° F. until it returned to it's original thickness, which is an indication that all absorbed solvent has been removed and the plate is ready to print. The time required for this part of the process is recorded as "Dry Time" in Table 3. After drying, the developed plate was examined with a 60× stereo microscope to determine the quality of the plate, with particular attention given to the sharpness of the dot structures, the shoulder structure on the relief image and the except for the use of a developer solvent containing 80 wt % diisopropylbenzene and 20 wt % tetrahydrofurfuryl alcohol. The results are included in Table 3.

EXAMPLE 14

A flexographic printing plate (0.250" Cyrel® TDR mfg. by Dupont) was exposed and developed as in Example 11, except for the use of a developer solvent containing 20 wt % diisopropylbenzene, 20 wt % benzyl alcohol and 60 wt % isoparaffinic hydrocarbon (EXXON Isopar® L). The results are included in Table 3.

EXAMPLE 15

A flexographic printing plate (0.250" Cyrel® TDR mfg. by Dupont) was exposed and developed as in Example 11, except for the use of a developer solvent containing 60 wt % diisopropylbenzene, 20 wt % benzyl alcohol and 20 wt % limonene. The results are included in Table 3.

COMPARATIVE EXAMPLE 9

A flexographic printing plate (0.250" Cyrel® TDR mfg. by Dupont) was exposed and developed as in Example 11, except for the use of a developer solvent containing 60 wt % aromatic petroleum distillate (Exxon Aromatic 150), 20 wt % benzyl alcohol and 20 wt % isobutyl isobutyrate (similar to a commercially available flexographic developer solvent). The results are included in Table 3.

COMPARATIVE EXAMPLE 10

A flexographic printing plate (0.250" Cyrel® TDR mfg. by Dupont) was exposed and developed as in Example 11, except for the use of a developer solvent containing 80 wt % limonene and 20 wt % benzyl alcohol. The results are included in Table 3.

COMPARATIVE EXAMPLE 11

A flexographic printing plate (0.250" Cyrel® TDR mfg. by Dupont) was exposed and developed as in Example 11, except for the use of a developer solvent containing 80 wt % isononyl acetate and 20 wt % benzyl alcohol (similar to a commercially available flexographic developer solvent). The results are included in Table 3.

COMPARATIVE EXAMPLE 12

A flexographic printing plate (0.250" Cyrel® TDR mfg. by Dupont) was exposed and developed as in Example 11, except for the use of a developer solvent containing 70 wt % isoheptyl acetate and 30 wt % isoheptyl alcohol (similar to a commercially available flexographic developer solvent). The results are included in Table 3.

86-93. The results are indicated in Table 4 along with the boiling point data as determined by ASTM D 86-93 for the constituents of the blend (diisopropylbenzene and benzyl alcohol).

As is evident, the boiling point was lower than that of the constituents, allowing recovery to occur at a lower temperature. Total recovery in the distillation was also higher than that of the individual ingredients. The boiling point was constant (+ or −2° C.) for 50% of the distillation.

EXAMPLE 17

In order to quantify the degree of boiling point suppression of the composition of the present invention, a blend of 70 wt % diisopropylbenzene and 30 wt % benzyl alcohol was distilled in a boiling point apparatus as per ASTM D 86-93. The results are indicated in Table 4 along with the boiling point data as determined by ASTM D 86-93 for the constituents of the blend (diisopropylbenzene and benzyl alcohol).

As is evident, the boiling point was lower than that of the constituents, allowing recovery to occur at a lower temperature. Total recovery in the distillation was also higher than that of the individual ingredients. The boiling point was constant (+ or −2° C.) for 70% of the distillation.

EXAMPLE 18

In order to quantify the degree of boiling point suppression of the composition of the present invention, a blend of 50 wt % diisopropylbenzene and 50 wt % benzyl alcohol was distilled in a boiling point apparatus as per ASTM D 86-93. The results are indicated in Table 4 along with the boiling point data as determined by ASTM D 86-93 for the constituents of the blend (diisopropylbenzene and benzyl alcohol).

TABLE 3

(0.250" Cyrel ® TDR plate mfg. by Dupont)

| Examples | Developer Solvent (blends by weight %) | Plate Type and Thickness | Solvent Odor | Wash Time (min) | Dry Time (min) | Image Quality |
|---|---|---|---|---|---|---|
| Example 11 | 85% diisopropylbenzene 15% benzyl alcohol | 0.250" Cyrel ® TDR (mfg. by Dupont) | Mild | 18 min | 105 min | Excellent |
| Example 12 | 100% diisopropylbenzene | 0.250" Cyrel ® TDR (mfg. by Dupont) | Mild | 20 min | 110 min | Excellent |
| Example 13 | 80% diisopropylbenzene 20% tetrahydrofurfuryl alcohol | 0.250" Cyrel ® TDR (mfg. by Dupont) | Moderate | 20 min | 105 min | Excellent |
| Example 14 | 20% diisopropylbenzene 20% benzyl alcohol 60% isoparaffinic hydrocarbon (EXXON Isopar ® L) | 0.250" Cyrel ® TDR (mfg. by Dupont) | Mild | 24 min | 100 min | Excellent |
| Example 15 | 60% diisopropylbenzene 20% benzyl alcohol 20% limonene | 0.250" Cyrel ® TDR (mfg. by Dupont) | Moderate | 16 min | 130 min | Good |
| Comparative Example 9 | 60% aromatic mixture (Exxon Aromatic 150) 20% benzyl alcohol 20% isobutyl isobutyrate | 0.250" Cyrel ® TDR (mfg. by Dupont) | Strong and Offensive | 26 min | 150 min | Good |
| Comparative Example 10 | 80% limonene 20% benzyl alcohol | 0.250" Cyrel ® TDR (mfg. by Dupont) | Strong | 15 min | 180 min | Fair (dot loss & image breakdown) |
| Comparative Example 11 | 80% isononyl acetate 20% benzyl alcohol | 0.250" Cyrel ® TDR (mfg. by Dupont) | Strong and Offensive | 60 min | 155 min | Good |
| Comparative Example 12 | 70% isoheptyl acetate 30% isoheptyl alcohol | 0.250" Cyrel ® TDR (mfg. by Dupont) | Strong and Offensive | 27 min | 145 min | Good |

EXAMPLE 16

In order to quantify the degree of boiling point suppression of the composition of the present invention, a blend of 85 wt % diisopropylbenzene and 15 wt % benzyl alcohol was distilled in a boiling point apparatus as per ASTM D As is evident, the boiling point was lower than that of the constituents, allowing recovery to occur at a lower temperature. Total recovery in the distillation was also higher than that of the individual ingredients. The boiling point was constant (+ or −2° C.) for 90% of the distillation.

TABLE 4

Boiling Point Data

| Observed Boiling Point (° C.) | DIPB | BA | Example #16 DIPB = 85 wt % BA = 15 wt % | Example #17 DIPB = 70 wt % BA = 30 wt % | Example #18 DIPB = 50 wt % BA = 50 wt % |
|---|---|---|---|---|---|
| Initial BP | 199° C. | 200° C. | 192° C. | 192° C. | 192° C. |
| BP @ 10% | 202° C. | 201° C. | 194° C. | 193° C. | 192° C. |
| BP @ 20% | 202° C. | 201° C. | 195° C. | 193° C. | 193° C. |
| BP @ 30% | 202° C. | 201° C. | 196° C. | 194° C. | 193° C. |
| BP @ 40% | 203° C. | 202° C. | 197° C. | 194° C. | 193° C. |
| BP @ 50% | 203° C. | 202° C. | 197° C. | 194° C. | 193° C. |
| BP @ 60% | 203° C. | 202° C. | 198° C. | 195° C. | 194° C. |
| BP @ 70% | 203° C. | 203° C. | 200° C. | 196° C. | 194° C. |
| BP @ 80% | 203° C. | 203° C. | 202° C. | 197° C. | 194° C. |
| BP @ 90% | 204° C. | 207° C. | 203° C. | 199° C. | 195° C. |
| Final BP | 209° C. | 214° C. | 204° C. | 204° C. | 197° C. |
| Total % Recovered | 92% | 95% | 98% | 98% | 99% |

NOTE:
DIPB = Diisopropylbenzene
BA = Benzyl Alcohol
BP = Observed Boiling Point (° C.)

EXAMPLE 19

In order to quantify the degree of boiling point suppression of the composition of the present invention, a blend of 70 wt % diisopropylbenzene and 30 wt % tetrahydrofurfuryl alcohol was distilled in a boiling point apparatus as per ASTM D 86-93. The results are indicated in Table 5 along with the boiling point data as determined by ASTM D 86-93 for the constituents of the blend (diisopropylbenzene and tetrahydrofurfuryl alcohol).

As is evident, the boiling point was lower than that of the active ingredient, diisopropylbenzene, allowing recovery to occur at a lower temperature. Total recovery in the distillation was also higher than that of the individual ingredients. The boiling point was constant (+ or −2° C.) for 40% of the distillation.

EXAMPLE 20

In order to quantify the degree of boiling point suppression of the composition of the present invention, a blend of 50 wt % diisopropylbenzene and 50 wt % tetrahydrofurfuryl alcohol was distilled in a boiling point apparatus as per ASTM D 86-93. The results are indicated in Table 5 along with the boiling point data as determined by ASTM D 86-93 for the constituents of the blend (diisopropylbenzene and tetrahydrofurfuryl alcohol).

As is evident, the boiling point was lower than that of the active ingredient, diisopropylbenzene, allowing recovery to occur at a lower temperature. Total recovery in the distillation was also higher than that of the individual ingredients. The boiling point was constant (+ or −2° C.) for 50% of the distillation.

TABLE 5

Boiling Point Data

| Observed Boiling Point (° C.) | DIPB | THFA | Example #19 DIPB = 70 wt % THFA = 30 wt % | Example #20 DIPB = 50 wt % THFA = 50 wt % |
|---|---|---|---|---|
| Initial BP | 199° C. | 169° C. | 172° C. | 172° C. |
| BP @ 10% | 202° C. | 174° C. | 181° C. | 174° C. |
| BP @ 20% | 202° C. | 175° C. | 181° C. | 174° C. |
| BP @ 30% | 202° C. | 175° C. | 181° C. | 175° C. |
| BP @ 40% | 203° C. | 175° C. | 181° C. | 175° C. |
| BP @ 50% | 203° C. | 175° C. | 185° C. | 176° C. |
| BP @ 60% | 203° C. | 175° C. | 191° C. | 178° C. |
| BP @ 70% | 203° C. | 175° C. | 199° C. | 180° C. |
| BP @ 80% | 203° C. | 176° C. | 203° C. | 193° C. |
| BP @ 90% | 204° C. | 177° C. | 204° C. | 202° C. |
| Final BP | 209° C. | 181° C. | 205° C. | 204° C. |
| Total % Recovered | 92% | 97% | 98% | 99% |

NOTE:
DIPB = Diisopropylbenzene
THFA = Tetrahydrofurfuryl Alcohol
BP = Observed Boiling Point (° C.)

EXAMPLE 21

In order to verify the selective solvency of the composition of the present invention a commercially available 0.067" thick flexographic printing plates (Cyrel® EXL mfg. by Dupont) was first exposed from the back using a UV light source to form the crosslinked polymer floor of the printing plate. The back exposure was for 20 seconds, which is enough to give a floor thickness of 0.033" to 0.034" (half of the total plate thickness). Next, the top of the plate was exposed to a UV light source without a negative overlay (all of the plate material was crosslinked) for 18 minutes in the exposure unit of a commercially available Kelleigh Model 310 Flexible Platemaker. The cover layer was then removed manually from the top of the exposed plate and it was trimmed to give a 1 inch×1 inch section of crosslinked photopolymer material. After determining an initial thickness and weight, the exposed section of photopolymer material was immersed in a mixture of 85 wt % diisopropylbenzene and 15 wt % benzyl alcohol at a temperature of 25–30° C. for 6 minutes. After immersion in the solvent bath for 6 minutes the section of photopolymer material was removed and the final weight and thickness was measured to determine swelling which is an indication of the aggressiveness of the solvent towards the crosslinked photopolymer.

The results are included in Table 6. NOTE: Aggressiveness of the solvents tested towards non-crosslinked photopolymer is indicated by the wash times in Table 1, Table 2 and Table 3.

As is evidenced by lower swelling and solvent absorption results (direct indicators of solvency), improved selective solvency for non-crosslinked photopolymers vs. crosslinked photopolymers (see Table 1 for solvency of non-crosslinked photopolymer in 0.067" Cyrel® EXL plate mfg. by Dupont as indicated by wash times) is indicated for the solvent of the present invention when compared to solvents of the prior art such as comparative examples 13, 14, 15 and 16.

EXAMPLE 22

The selective solvency test procedure of Example 21 was carried out, except for the use of a solvent containing 100 wt % diisopropylbenzene. The results are included in Table 6.

As is evidenced by lower swelling and solvent absorption results (direct indicators of solvency), improved selective solvency for non-crosslinked photopolymers vs. crosslinked photopolymers (see Table 1 for solvency of non-crosslinked photopolymer in 0.067" Cyrel® EXL plate mfg. by Dupont as indicated by wash times) is indicated for the solvent of the present invention when compared to solvents of the prior art such as comparative examples 13, 14, 15 and 16.

EXAMPLE 23

The selective solvency test procedure of Example 21 was carried out, except for the use of a developer solvent containing 80 wt % diisopropylbenzene and 20 wt % tetrahydrofurfuryl alcohol. The results are included in Table 6.

As is evidenced by lower swelling and solvent absorption results (direct indicators of solvency), improved selective solvency for non-crosslinked photopolymers vs. crosslinked photopolymers (see Table 1 for solvency of non-crosslinked photopolymer in 0.067" Cyrel® EXL plate mfg. by Dupont as indicated by wash times) is indicated for the solvent of the present invention when compared to solvents of the prior art such as comparative examples 13, 14, 15 and 16.

EXAMPLE 24

The selective solvency test procedure of Example 21 was carried out, except for the use of a developer solvent containing 20 wt % diisopropylbenzene, 20 wt % benzyl alcohol and 60 wt % isoparaffinic hydrocarbon (EXXON Isopar® L). The results are included in Table 6.

As is evidenced by lower swelling and solvent absorption results (direct indicators of solvency), improved selective solvency for non-crosslinked photopolymers vs. crosslinked photopolymers (see Table 1 for solvency of non-crosslinked photopolymer in 0.067" Cyrel® EXL plate mfg. by Dupont as indicated by wash times) is indicated for the solvent of the present invention when compared to solvents of the prior art such as comparative examples 13, 14, 15 and 16.

COMPARATIVE EXAMPLE 13

The selective solvency test procedure of Example 21 was carried out, except for the use of a developer solvent containing 60 wt % aromatic petroleum distillate (Exxon Aromatic 150), 20 wt % benzyl alcohol and 20 wt % isobutyl isobutyrate (similar to a commercially available flexographic developer solvent). The results are included in Table 6.

COMPARATIVE EXAMPLE 14

A flexographic printing plate (0.067" Cyrel® EXL mfg. by Dupont) was exposed and developed as in Example 21, except for the use of a developer solvent containing 80 wt % limonene and 20 wt % benzyl alcohol. The results are included in Table 6.

COMPARATIVE EXAMPLE 15

A flexographic printing plate (0.067" Cyrel® EXL mfg. by Dupont) was exposed and developed as in Example 21, except for the use of a developer solvent containing 80 wt % isononyl acetate and 20 wt % benzyl alcohol (similar to a commercially available flexographic developer solvent). The results are included in Table 6.

COMPARATIVE EXAMPLE 16

A flexographic printing plate (0.067" Cyrel® EXL mfg. by Dupont) was exposed and developed as in Example 21, except for the use of a developer solvent containing 70 wt % isoheptyl acetate and 30 wt % isoheptyl alcohol (similar to a commercially available flexographic developer solvent). The results are included in Table 6.

TABLE 6

Swelling and Weight Gain Data

| Examples | Developer Solvent (blends by weight %) | Initial Thickness | Final Thickness | % Swell | Initial Weight | Final Weight | % Weight Increase |
|---|---|---|---|---|---|---|---|
| Example 21 | 85% diisopropylbenzene 15% benzyl alcohol | 0.067 in | 0.069 in | 2.9% | 1.11 gm | 1.15 gm | 3.6% |
| Example 22 | 100% diisopropylbenzene | 0.067 in | 0.0695 in | 3.6% | 1.34 gm | 1.39 gm | 3.7% |
| Example 23 | 80% diisopropylbenzene 20% tetrahydrofurfuryl alcohol | 0.067 in | 0.069 in | 2.9% | 1.15 gm | 1.19 gm | 3.5% |
| Example 24 | 20% diisopropylbenzene 20% benzyl alcohol 60% isoparaffinic hydrocarbon (EXXON Isopar ® L) | 0.067 in | 0.0685 in | 2.2% | 1.03 gm | 1.06 gm | 2.9% |
| Comparative Example 13 | 60% aromatic mixture (Exxon Aromatic 150) 20% benzyl alcohol 20% isobutyl isobutyrate | 0.067 in | 0.074 in | 9.5% | 1.21 gm | 1.33 gm | 9.9% |
| Comparative Example 14 | 80% limonene 20% benzyl alcohol | 0.067 in | 0.077 in | 13.0% | 1.42 gm | 1.60 gm | 12.7% |
| Comparative Example 15 | 80% isononyl acetate 20% benzyl alcohol | 0.067 inch | 0.071 in | 5.6% | 1.25 gm | 1.32 gm | 5.6% |

TABLE 6-continued

Swelling and Weight Gain Data

| Examples | Developer Solvent (blends by weight %) | Initial Thickness | Final Thickness | % Swell | Initial Weight | Final Weight | % Weight Increase |
|---|---|---|---|---|---|---|---|
| Comparative Example 16 | 70% isoheptyl acetate 30% isoheptyl alcohol | 0.067 inch | 0.072 inch | 6.9% | 1.18 gm | 1.26 gm | 6.8% |

While the invention has been described in detail and with reference to specific examples, it will be apparent to one skilled in the art that various changes, alternatives, and modifications can be made without departing from the spirit and scope of the present invention, which is to be defined by the following claims.

We claim:

1. A photopolymer developing solution comprising diisopropylbenzene and a co-solvent, characterized in that said solution selectively removes non-crosslinked polymer from a substrate without removing cross-linked polymer, wherein said co-solvent is selected from the group consisting of tetrahydrofurfuryl alcohol, 2-ethoxyethanol, terpineol, cyclohexanol, methyl cyclohexanol, hexyl alcohol, heptyl alcohol, dipropylene glycol methyl ether, 2-butoxyethanol, 2-(2-butoxyethoxy) ethanol, napthenic hydrocarbons, paraffinic hydrocarbons, olefinic hydrocarbons, isoparaffinic hydrocarbons, terpenes and mixtures thereof.

2. A photopolymer developing solution comprising diisopropylbenzene and a co-solvent, characterized in that said solution selectively removes non-crosslinked polymer from a substrate without removing cross-linked polymer, wherein the co-solvent is tetrahydrofurfuryl alcohol.

3. The photopolymer developing solution of claim 1, said photopolymer developing solution comprising up to about 80 wt % of said co-solvent.

4. The photopolymer developing solution of claim 1, where said photopolymer developing solution produces less than 4% swelling in a crosslinked photopolymer after exposure to said photopolymer developing solution for a period of time sufficient to develop the substrate.

5. The photopolymer developing solution of claim 1, where said photopolymer developing solution produces less than 4% weight gain in a crosslinked photopolymer after exposure to said photopolymer developing solution for a period of time sufficient to develop the substrate.

6. The photopolymer developing solution of claim 1, where the boiling point of said photopolymer developing solution is lower than the individual boiling points of said diisopropylbenzene and said co-solvent.

7. The photopolymer developing solution of claim 2, said photopolymer developing solution comprising up to about 80 wt % of said co-solvent.

8. The photopolymer developing solution of claim 2, where said photopolymer developing solution produces less than 4% swelling in a crosslinked photopolymer after exposure to said photopolymer developing solution for a period of time sufficient to develop the substrate.

9. The photopolymer developing solution of claim 2, where said photopolymer developing solution produces less than 4% weight gain in a crosslinked photopolymer after exposure to said photopolymer developing solution for a period of time sufficient to develop the substrate.

10. The photopolymer developing solution of claim 2, where the boiling point of said photopolymer developing solution is lower than the individual boiling points of said diisopropylbenzene and said co-solvent.

11. A photopolymer developing solution comprising diisopropylbenzene and a co-solvent, characterized in that said solution selectively removes non-crosslinked polymer from a substrate without removing cross-linked polymer, wherein the co-solvent is cyclohexanol.

12. The photopolymer developing solution of claim 11, said photopolymer developing solution comprising up to about 80 wt % of said co-solvent.

13. The photopolymer developing solution of claim 11, where said photopolymer developing solution produces less than 4% swelling in a crosslinked photopolymer after exposure to said photopolymer developing solution for a period of time sufficient to develop the substrate.

14. The photopolymer developing solution of claim 11, where said photopolymer developing solution produces less than 4% weight gain in a crosslinked photopolymer after exposure to said photopolymer developing solution for a period of time sufficient to develop the substrate.

15. The photopolymer developing solution of claim 11, where the boiling point of said photopolymer developing solution is lower than the individual boiling points of said diisopropylbenzene and said co-solvent.

* * * * *